(12) United States Patent
Lee et al.

(10) Patent No.: US 11,644,745 B2
(45) Date of Patent: May 9, 2023

(54) PHOTOLITHOGRAPHY METHOD

(71) Applicant: Samsung Electronics Co., Ltd., Suwon-si (KR)

(72) Inventors: Yongwook Lee, Yongin-si (KR); Yongwoo Kim, Seoul (KR); Seunggu Baek, Hwaseong-si (KR); Woojae Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 16/906,004

(22) Filed: Jun. 19, 2020

(65) Prior Publication Data
US 2021/0165316 A1 Jun. 3, 2021

(30) Foreign Application Priority Data
Nov. 29, 2019 (KR) .................. 10-2019-0157681

(51) Int. Cl.
| | | |
|---|---|---|
| G03F 1/52 | (2012.01) | |
| H01L 21/027 | (2006.01) | |
| G03F 7/038 | (2006.01) | |
| G03F 7/20 | (2006.01) | |
| G03F 1/42 | (2012.01) | |
| G03F 7/039 | (2006.01) | |

(52) U.S. Cl.
CPC .................. *G03F 1/52* (2013.01); *G03F 1/42* (2013.01); *G03F 7/038* (2013.01); *G03F 7/039* (2013.01); *G03F 7/2004* (2013.01); *G03F 7/2022* (2013.01); *G03F 7/70058* (2013.01); *H01L 21/0274* (2013.01)

(58) Field of Classification Search
CPC ... G03F 1/52; G03F 1/42; G03F 7/038; G03F 7/039; G03F 7/2004; G03F 7/2022; G03F 7/70058; G03F 7/2002; H01L 21/0274
See application file for complete search history.

(56) References Cited

U.S. PATENT DOCUMENTS

| | | | |
|---|---|---|---|
| 5,783,342 A * | 7/1998 | Yamashita | ................ G03F 7/38 430/311 |
| 8,168,352 B2 | 5/2012 | Hayashi et al. | |
| 8,216,744 B2 | 7/2012 | Itoh | |
| 8,765,331 B2 | 7/2014 | Gallagher et al. | |
| 8,795,931 B2 | 8/2014 | Ryu et al. | |
| 9,066,425 B2 | 6/2015 | Joo et al. | |
| 9,213,232 B2 | 12/2015 | Hsu et al. | |
| 10,007,191 B2 | 6/2018 | Biafore et al. | |
| 2005/0053851 A1 * | 3/2005 | Berman | .............. G03F 7/70875 430/394 |

(Continued)

*Primary Examiner* — Hung V Nguyen
(74) *Attorney, Agent, or Firm* — Muir Patent Law, PLLC (57) ABSTRACT

A photolithography method is provided. The photolithography method includes forming a photoresist layer on a wafer, exposing a portion of the photoresist layer by using an exposure device and a mask, and forming a photoresist pattern by removing a non-exposed portion of the photoresist layer. The mask includes a substrate having a main pattern area and a blocking area outside the main pattern area, a main pattern on the main pattern area of the substrate, and a blocking pattern on the blocking area of the substrate. An external circumference of the blocking pattern extends to the maximum area of the mask that may be illuminated by the exposure device or to the outside of the maximum area of the mask.

18 Claims, 9 Drawing Sheets

(56) References Cited

U.S. PATENT DOCUMENTS

2006/0078828 A1* 4/2006 Atkinson ............ G03F 7/70425
 430/313
2018/0059529 A1 3/2018 Jonckheere et al.
2018/0143527 A1 5/2018 Seo et al.
2019/0146326 A1 5/2019 Tien et al.

* cited by examiner

PHOTOLITHOGRAPHY METHOD

CROSS-REFERENCE TO RELATED APPLICATION

This application claims the benefit under 35 U.S.C. § 119 of Korean Patent Application No. 10-2019-0157681, filed on Nov. 29, 2019, in the Korean Intellectual Property Office, the disclosure of which is incorporated herein in its entirety by reference.

BACKGROUND

The inventive concept relates to a photolithography method, and more particularly, to a photolithography method using a mask.

In order to form a fine pattern, photolithography may be used. Photolithography may include exposing only a desired portion of photoresist on a wafer to light by using a mask. However, when undesired scattered light reaches undesired portions of photoresist, the size of a resultant pattern may be affected. Therefore, it is necessary to prevent the scattered light from reaching the photoresist.

SUMMARY

The inventive concept relates to a photolithography method capable of minimizing a change in size of a pattern, which is caused by scattered light.

According to an aspect of the inventive concept, there is provided a photolithography method including forming a photoresist layer on a wafer, exposing a portion of the photoresist layer by using an exposure device and a mask, and forming a photoresist pattern by removing a non-exposed portion of the photoresist layer. The mask includes a substrate having a main pattern area and a blocking area outside the main pattern area, a main pattern on the main pattern area of the substrate, and a blocking pattern on the blocking area of the substrate. An external circumference of the blocking pattern extends to the maximum area of the mask that may be illuminated by the exposure device or to the outside of the maximum area of the mask.

According to an aspect of the inventive concept, there is provided a photolithography method including forming a target layer on a wafer, forming a photoresist layer on the target layer, exposing a portion of the photoresist layer by using an exposure device and a mask, forming a photoresist pattern by removing a non-exposed portion of the photoresist layer by using negative tone development (NTD), forming a target pattern by etching the target layer by using the photoresist pattern as an etching mask, and removing the photoresist pattern. The mask includes a main pattern configured to be projected onto a non-overlap area of a shot area of the wafer, a dummy pattern configured to be projected onto an overlap area of the shot area of the wafer, and a blocking pattern configured not to be projected onto the wafer. An external length of the blocking pattern in an X direction is greater than or equal to multiplication of a length of a maximum shot area of the wafer that may be illuminated by the exposure device in the X direction by a mask-wafer reduction ratio of the exposure device. An external length of the blocking pattern in a Y direction is greater than or equal to multiplication of a length of the maximum shot area of the wafer that may be illuminated by the exposure device in the Y direction by the mask-wafer reduction ratio of the exposure device.

According to an aspect of the inventive concept, there is provided a photolithography method including forming a photoresist layer on a wafer, exposing a portion of the photoresist layer by using an exposure device and a mask, and forming a photoresist pattern by removing a non-exposed portion of the photoresist layer. The exposure device includes an illuminator configured to control light received from a light source and illuminate the mask, a mask table on which the mask is mounted, a mask blinder positioned between the mask table and the illuminator and configured to control an area of the mask illuminated by the exposure device in a maximum area of the mask that may be illuminated by the exposure device, a projection system configured to project light that passes through the mask onto the wafer, and a wafer table on which the wafer is mounted. The mask includes a substrate having a main pattern area and a blocking area that two-dimensionally surrounds the main pattern area, a main pattern on the main pattern area of the substrate, and a blocking pattern on the blocking area of the substrate. An external length of the blocking pattern in an X direction is greater than or equal to a length of the maximum area of the mask in the X direction. an external length of the blocking pattern in a Y direction is greater than or equal to a length of the maximum area of the mask in the Y direction.

BRIEF DESCRIPTION OF THE DRAWINGS

Embodiments of the inventive concept will be more clearly understood from the following detailed description taken in conjunction with the accompanying drawings in which like numbers refer to like elements throughout. In the drawings.

DETAILED DESCRIPTION OF THE EMBODIMENTS

Figure 1:
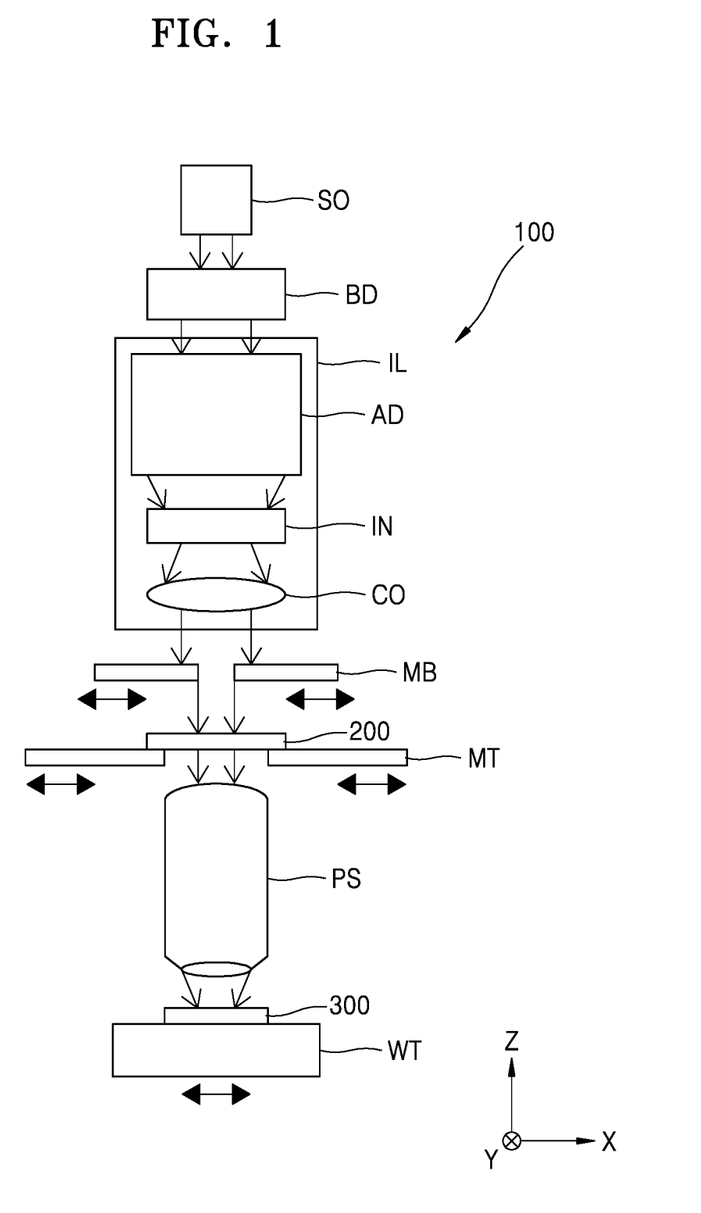
FIG. 1 is a schematic diagram illustrating an exposure device used for a photolithography method, according to an example embodiment of the inventive concept.

FIG. 1 is a schematic diagram illustrating an exposure device 100 used for a photolithography method, according to an example embodiment of the inventive concept.

Referring to FIG. 1, the exposure device 100 may include a light source SO, a beam delivery system BD, an illuminator IL, a mask blinder MB, a mask table MT, a projection system PS, and a wafer table WT along a traveling path of light.

The light source SO may emit ultraviolet light (e.g., light having a wavelength in a range of about 10 nm to about 400 nm), near ultraviolet light (e.g., light having a wavelength in a range of about 300 nm to about 400 nm), deep ultraviolet light (e.g., light having a wavelength in a range of about 200 nm to about 300 nm), or extreme ultraviolet light (e.g., light having a wavelength in a range of about 10 nm to about 200 nm). In some embodiments, the light source SO may emit the deep ultraviolet light. In an embodiment in which the light source SO is an excimer laser, the light source SO may not be included as a part of the exposure device 100 and may be a component separate from the exposure device 100. In an embodiment in which the light source SO is a mercury lamp, the light source SO may be included as a part of the exposure device 100.

The beam delivery system BD may transmit light from the light source SO to the illuminator IL. The beam delivery system BD may include a suitable directing mirror and/or beam expander. The illuminator IL may control light received from the light source SO with the help of the beam delivery system BD and illuminate a mask 200. The illuminator IL may include various types of optical components for direction, shaping, and/or controlling light, for example, refractive, reflective, magnetic, electromagnetic, electrostatic, or another type of optical component, or an arbitrary combination of the above optical components. The illuminator IL may include a controller AD, a collector IN, and a condenser CO for controlling the angular intensity distribution of light. The illuminator IL may control light so that the light may have desired uniformity and intensity distribution.

The mask blinder MB may control an area MA (refer to FIGS. 2A and 2B) of the mask 200 illuminated by the exposure device 100. In some embodiments, the mask blinder MB may be positioned between the mask table MT and the illuminator IL, and a portion of light emitted by the illuminator IL may reach the mask 200 through an opening of the mask blinder MB, while the remaining of the light emitted by the illuminator IL may be blocked by the mask blinder MB. When the opening of the mask blinder MB is maximally opened, a maximum area MAm (refer to FIGS. 2A and 2B) of the mask 200 may be illuminated by the exposure device 100. By controlling the size of the opening of the mask blinder MB, the area MA (refer to FIGS. 2A and 2B) of the mask 200 illuminated by the exposure device 100 may be controlled within the maximum area MAm (refer to FIGS. 2A and 2B).

The mask 200 may be mounted on the mask table MT. The mask table MT may move the mask 200 and may be connected to a mask position setter configured to correctly set the position of the mask 200 in accordance with a specific parameter. For example, the mask table MT may move the mask in an X direction and/or a Y direction. The projection system PS may project light that passes through the mask 200 onto a wafer 300. The projection system PS may include, for example, a refractive projection lens system. The wafer 300 may be mounted on the wafer table WT. The wafer table WT may move the wafer 300 and may be connected to a wafer position setter configured to correctly set the position of the wafer 300 in accordance with a specific parameter. For example, the wafer table WT may move the wafer in an X direction and/or a Y direction. The X direction may be perpendicular to the Y direction, and the X and Y directions both may be perpendicular to the Z direction and parallel to a top surface of the wafer 300. The Z direction may be perpendicular to a top surface of the wafer 300.

In some embodiments, a space between the projection system PS and the wafer 300 may be filled with a liquid having a relatively high refractive index, for example, water. An immersion solution may also be applied to another space of the exposure device 100 such as a space between the mask 200 and the projection system PS. An immersion technology may increase a numerical aperture of the projection system PS.

Figure 2A:
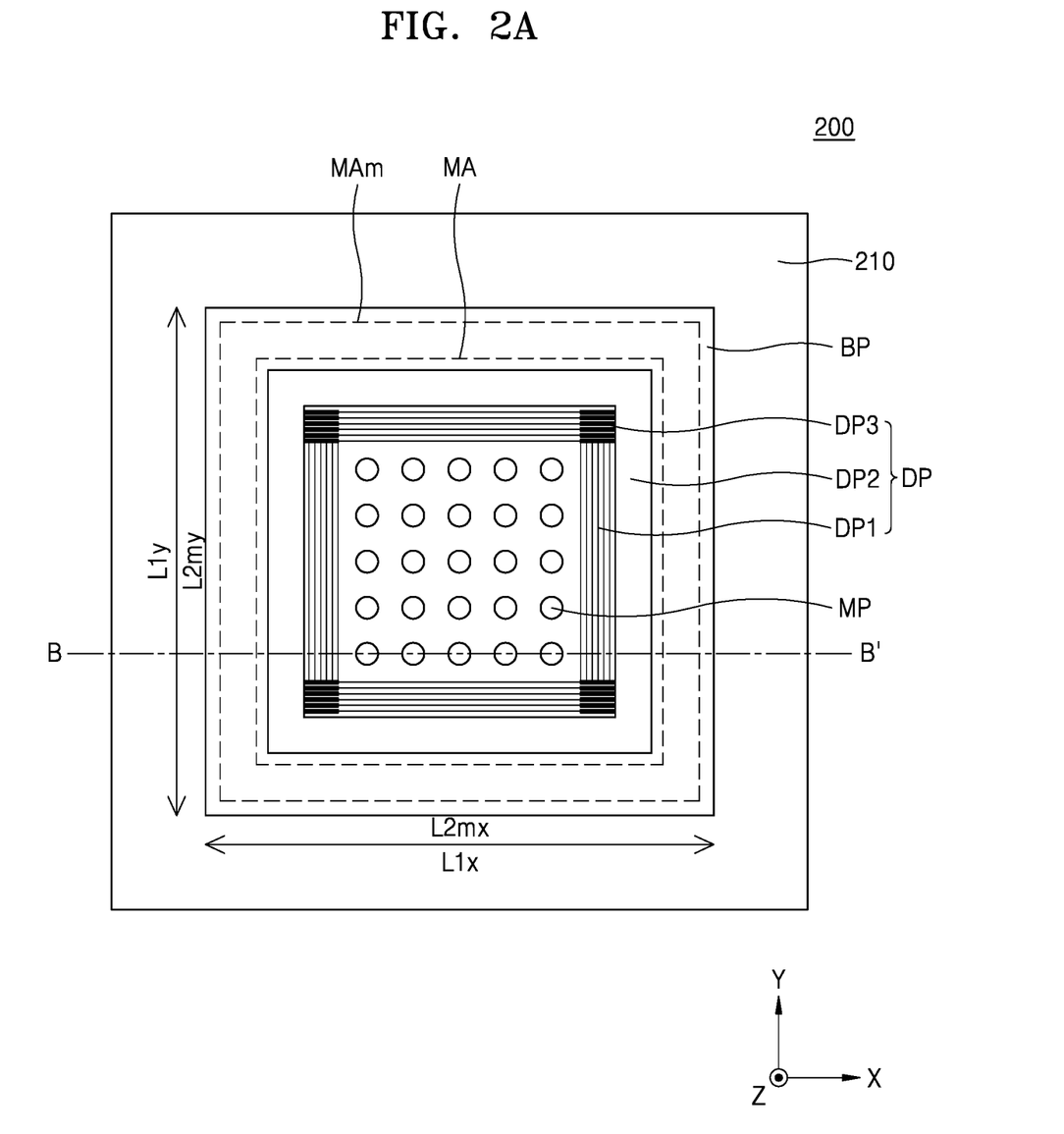
FIG. 2A is a plan view illustrating a mask used for a photolithography method, according to an example embodiment of the inventive concept.
Figure 2B:
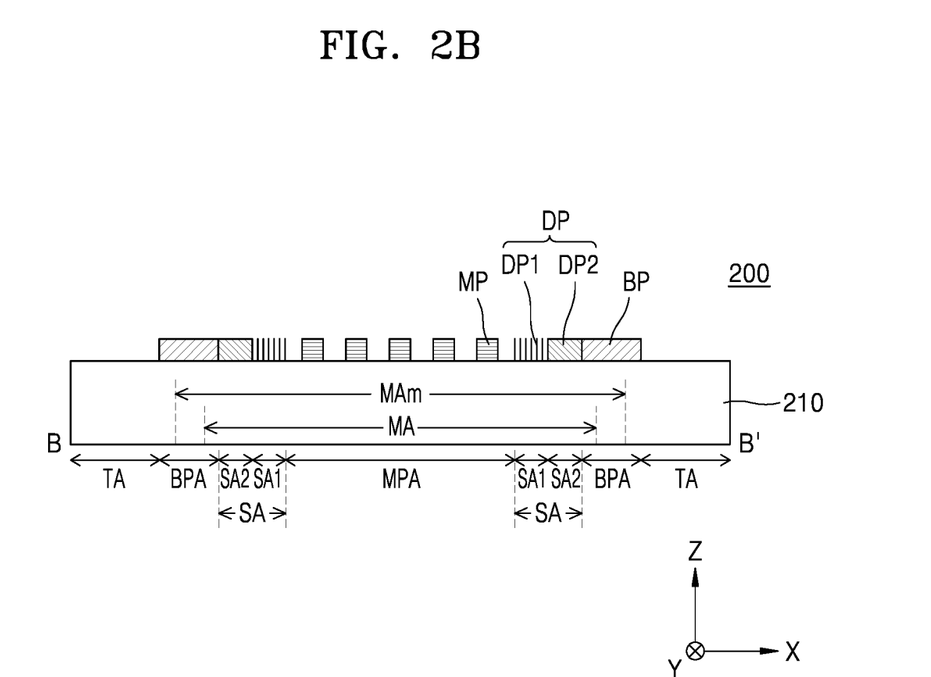
FIG. 2B is a cross-sectional view illustrating a mask used for a photolithography method, according to an example embodiment of the inventive concept.
Figure 3:
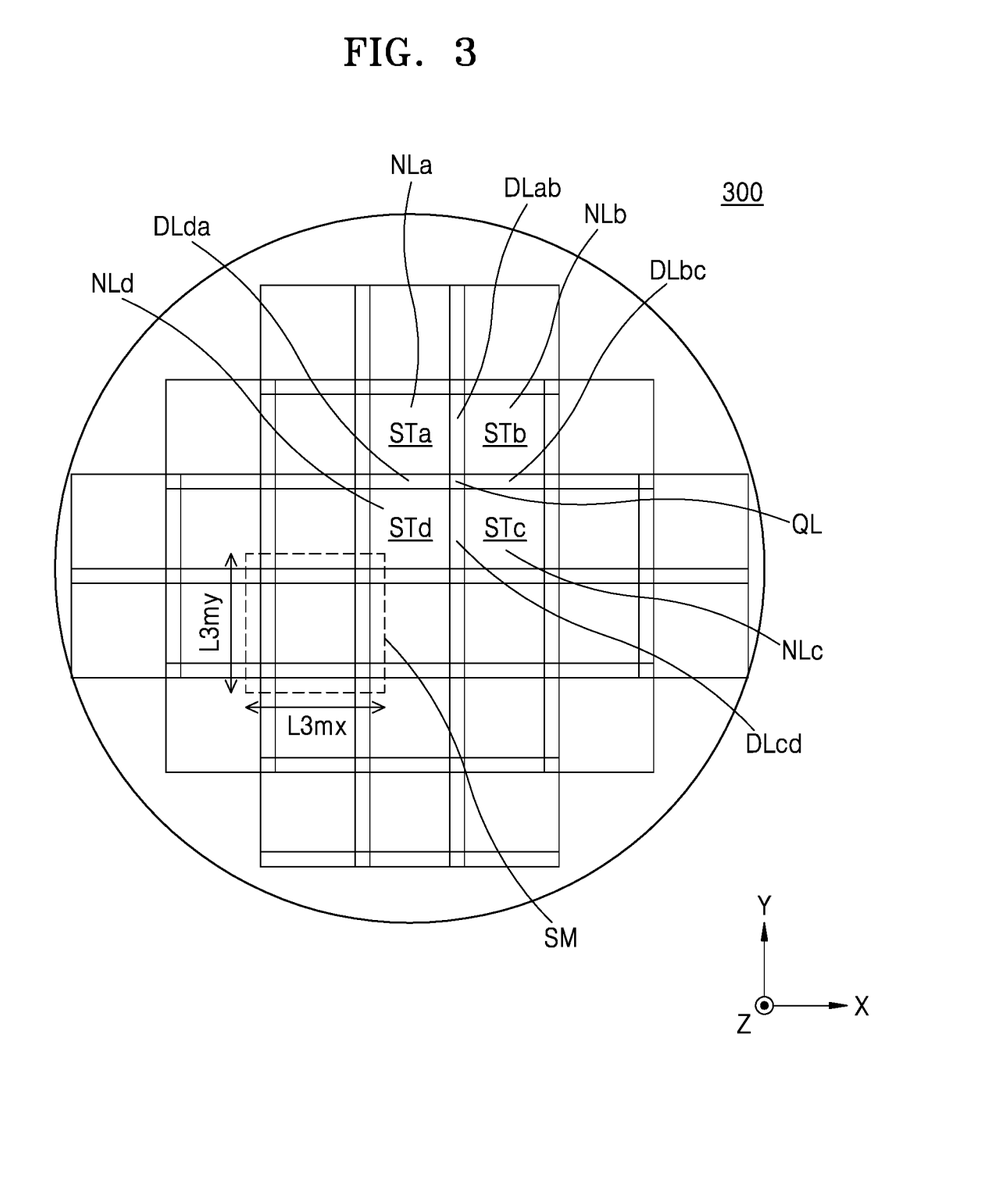
FIG. 3 is a plan view illustrating a wafer used for a photolithography method, according to an example embodiment of the inventive concept.

FIGS. 2A and 2B are respectively a plan view illustrating the mask 200 used for a photolithography method according to an example embodiment of the inventive concept and a cross-sectional view illustrating the mask 200 used for a photolithography method according to an example embodiment of the inventive concept. FIG. 3 is a plan view illustrating the wafer 300 used for a photolithography method according to an example embodiment of the inventive concept.

Referring to FIGS. 2A, 2B, and 3, the mask 200 may include a substrate 210 and a main pattern MP and a blocking pattern BP on the substrate 210. The substrate 210 may include a main pattern area MPA and a blocking area BPA outside the main pattern area MPA. The blocking area BPA of the substrate 210 may two-dimensionally surround the main pattern area MPA. For example, the blocking area BPA of the substrate 210 may extend along a circumference of the main pattern area MPA. The substrate 210 may include a material that may transmit light, for example, quartz, glass, and/or plastic. The plastic may include, for example, polyimide, polyamide, liquid crystal polyarylate, polyethylene terephthalate (PET), polyether ether ketone (PEEK), polyethersulfone (PES), polyethernitrile (PEN), polyester, polycarbonate, polyarylate, polysulfone, polyetherimide, or a combination of the above materials.

The main pattern MP may be positioned on the main pattern area MPA of the substrate 210. The main pattern MP may be projected onto four non-overlapping areas (for example, first to fourth non-overlapping areas NLa to NLd) of the wafer 300. In some embodiments, in order to form a finer pattern, a phase of light that passes through the main pattern MP may be reversed by the main pattern MP. In this case, the main pattern MP may include an MoSi-based material, for example, MoSiN, MoSiCN, MoSiON, MoSi-CON, or MoSiON. In another embodiment, the main pattern MP may reflect light. In this case, the main pattern MP may include a chrome (Cr)-based material, for example, Cr oxide, Cr nitride, Cr carbide, Cr oxynitride, or Cr oxynitridecarbide.

The blocking pattern BP may be positioned on the blocking area BPA of the substrate 210. The blocking pattern BP may not be projected onto the wafer 300. The blocking pattern BP may reflect light. The blocking pattern BP may include a Cr-based material, for example, Cr oxide, Cr nitride, Cr carbide, Cr oxynitride, or Cr oxynitridecarbide. In some embodiments, the blocking pattern BP may further include a MoSi-based material layer under a Cr-based material layer, for example, a MoSiN layer, a MoSiCN layer, a MoSiON layer, a MoSiCON layer, or a MoSiON layer. The blocking pattern BP may be in the form of a frame that surrounds the main pattern MP.

The blocking pattern BP may prevent scattered light (for example, generated by a foreign substance on a lens or generated by light reflected from the mask) incident on the outside of the area MA of the mask 200 designed to be illuminated by the exposure device 100 from passing through the mask 200 and reaching the wafer 300. Therefore, the influence of the scattered light on the size of a pattern formed on the wafer 300 may be minimized.

An internal circumference of the blocking pattern BP may extend to the area MA of the mask 200 designed to be illuminated by the exposure device 100 or to the inside of the area MA of the mask 200 designed to be illuminated by the exposure device 100. For example, the internal circumference of the blocking pattern BP may overlap the inside of the area MA of the mask 200. An external circumference of the blocking pattern BP may extend to the maximum area MAm of the mask 200 that may be illuminated by the exposure device 100 or to the outside of the maximum area MAm of the mask 200 that may be illuminated by the exposure device 100. For example, an external length L1$x$ of the blocking pattern BP in an X direction may be greater than or equal to a length L2$mx$ of the maximum area MAm of the mask 200 that may be illuminated by the exposure device 100 in the X direction and an external length L1$y$ of the blocking pattern BP in a Y direction may be greater than or equal to a length L2$my$ of the maximum area MAm of the mask 200 that may be illuminated by the exposure device 100 in the Y direction. In some embodiments, the external circumference of the blocking pattern BP may be equal to or greater than the circumference of the maximum area MAm of the mask 200. Since the size of the external circumference of the blocking pattern BP may be determined with reference to the maximum area MAm of the mask 200 that may be illuminated by the exposure device 100, the scattered light may be blocked by using the same reference for masks having various sizes of main pattern areas MPA in order to manufacture products having various sizes of chips.

In some embodiments, the substrate 210 may further include a scribe lane area SA between the main pattern area MPA and the blocking pattern BPA and the mask 200 may further include a dummy pattern DP on the scribe lane area SA of the substrate 210.

In some embodiments, the dummy pattern DP may reverse a phase of light that passes through the dummy pattern DP. In this case, the dummy pattern DP may include a MoSi-based material, for example, MoSiN, MoSiCN, MoSiON, MoSiCON, or MoSiON. In other embodiments, the dummy pattern DP may reflect light. In this case, the dummy pattern DP may include a Cr-based material, for example, Cr oxide, Cr nitride, Cr carbide, Cr oxynitride, or Cr oxynitridecarbide.

In some embodiments, the scribe lane area SA of the substrate 210 may include a first sub-scribe lane area SA1 adjacent to the main pattern area MPA and a second sub-scribe lane area SA2 adjacent to the blocking pattern BP. In other words, the substrate 210 may sequentially include the main pattern area MPA, the first sub-scribe lane area SA1, the second sub-scribe lane area SA2, and the blocking area BPA from the center of the substrate 210 toward outside of the substrate 210. The dummy pattern DP may include a first dummy pattern DP1 on the first sub-scribe lane area SA1 and a second dummy pattern DP2 on the second sub-scribe lane area SA2. For example, the first dummy pattern DP1 may be positioned outside the main pattern MP and the second dummy pattern DP2 may be positioned outside the first dummy pattern DP1. The second dummy pattern DP2 may surround the first dummy pattern DP1. In some embodiments, the dummy pattern DP may further include third dummy patterns DP3 that may be positioned at respective corners of the scribe lane area SA. The first dummy pattern DP1 and the second dummy pattern DP2 may be projected onto double overlap areas (for example, DLab, DLbc, DLcd, and DLda) of the wafer 300, and the third dummy patterns DP3 may be projected onto quad overlap areas QL of the wafer 300.

In FIGS. 2A and 2B, it is illustrated that the first dummy pattern DP1 is in the form of a line and space pattern and the second dummy pattern DP2 completely covers the second sub-scribe lane area SA2. However, in other embodiments, the first dummy pattern DP1 and the second dummy pattern DP2 may have other arbitrary shapes considering a shape of a pattern desired to be formed on the double overlap area (for example, double overlap areas DLab, DLbc, DLcd, and DLda) of the wafer 300. In FIGS. 2A and 2B, it is illustrated that each of the third dummy patterns DP3 is in the form of a line and space pattern. However, in other embodiments, each of the third dummy patterns DP3 may have another arbitrary shape considering a shape of a pattern desired to be formed on the quad overlap area QL of the wafer 300.

In some embodiments, the substrate 210 may further include a transmissive area TA positioned outside the blocking area BPA. The transmissive area TA of the substrate 210 may not be covered by the blocking pattern BP. In other words, the blocking pattern BP may not be extended to an edge of the mask 200. That is because forming the blocking pattern BP so that the blocking pattern BP extends to the edge of the mask 200 may increase the manufacturing expenses and time of the mask 200 when the mask 200 is manufactured by using, for example, electron-beam lithography and negative tone development.

In some embodiments, the wafer 300 may include a semiconductor material. However, in other embodiments, the wafer 300 may include an arbitrary material such as glass, plastic, or metal. The semiconductor material may include a Group IV semiconductor material, a Group III-V semiconductor material, a Group II-VI semiconductor material, or a combination of the above semiconductor materials. The Group IV semiconductor material may be, for example, silicon (Si), germanium (Ge), or a combination of the above semiconductor materials. The Group III-V semiconductor material may be, for example, GaAs, InP, GaP, InAs, InSb, or a combination of the above semiconductor materials. The Group II-VI semiconductor material may be, for example, ZnTe, CdS, or a combination of the above semiconductor materials.

The wafer 300 may have a plurality of shot areas (for example, shot areas STa to STd). Light that passes through the mask 200 is designed to illuminate only the shot areas of the wafer 300. Each of the first to fourth shot areas STa to STd of the wafer 300 may be smaller than or the same size as the maximum shot area SM of the wafer 300 in which the wafer 300 may be illuminated by the exposure device 100. The maximum shot area SM of the wafer 300 may be included in a specification of the exposure device, which is commonly provided by an exposure device manufacturer. For example, a length of the maximum shot area SM of the wafer 300 of each of TWINSCAN NXT:2000i, TWINSCAN NXTL1980Di, TWINSCANNXT:1970Ci, TWINSCAN NXT:1965Ci, TWINSCAN XT:1460K, TWINSCAN XT:1060K, and TWINSCAN XT:860M that may be currently widely used and obtained from ASML (Veldhoven Netherlands) in the X direction is 26 mm and a length of the maximum shot area SM of the wafer 300 of each of TWINSCAN NXT:2000i, TWINSCAN NXTL1980Di, TWINSCANNXT:1970Ci, TWINSCAN NXT:1965Ci, TWINSCAN XT:1460K, TWINSCAN XT:1060K, and TWINSCAN XT:860M that may be currently widely used and obtained from ASML (Veldhoven Netherlands) in the Y direction is 33 mm.

The size of the maximum area MAm of the mask 200 that may be illuminated by the exposure device 100 may have a value obtained by multiplying the size of the maximum shot area SM of the wafer 300 that may be illuminated by the exposure device 100 by a mask-wafer reduction ratio. In the present specification, the mask-wafer reduction ratio means a ratio in which a pattern (for example, the main pattern MP) of the mask 200 is reduced to a pattern on the wafer 300.

Therefore, an external length L1x of the blocking pattern BP of the mask 200 in the X direction may be greater than or equal to multiplication of a length L3mx of the maximum shot area SM of the wafer 300 in the X direction by the mask-wafer reduction ratio of the exposure device 100 and the external length L1y of the blocking pattern BP of the mask 200 in the Y direction may be greater than or equal to multiplication of the length L3mx of the maximum shot area SM of the wafer 300 in the X direction by the mask-wafer reduction ratio of the exposure device 100. In some embodiments, the length L2mx of the maximum area MAm of the mask 200 in the X direction may be a multiplication of 26 mm by the mask-wafer reduction ratio and the length L2my of the maximum area MAm of the mask 200 in the Y direction may be a multiplication of 33 mm by the mask-wafer reduction ratio. Therefore, a ratio of the length L2mx of the maximum area MAm of the mask 200 that may be exposed by the exposure device 100 in the X direction to the length L2my of the maximum area MAm of the mask 200 in the Y direction may be 26:33.

In TWINSCAN NXT:2000i, TWINSCAN NXTL1980Di, TWINSCANNXT:1970Ci, TWINSCAN NXT:1965Ci, TWINSCAN XT:1460K, TWINSCAN XT:1060K, and TWINSCAN XT:860M that may be currently widely used and obtained from ASML (Veldhoven Netherlands), the mask-wafer reduction ratio is 4. Therefore, in some embodiments, the length L2mx of the maximum area MAm of the mask 200 in the X direction is 104 mm and the length L2my of the maximum area MAm of the mask 200 in the Y direction may be 132 mm.

Adjacent shot areas, for example, a first shot area STa and a second shot area STb, the second shot area STb and a third shot area STc, the third shot area STc and a fourth shot area STd, and the fourth shot area STd and the first shot area STa of the wafer 300, may overlap. The first shot area STa and the second shot area STb of the wafer 300 may share a first double overlap area DLab in which a portion of the first shot area STa and a portion of the second shot area STb of the wafer 300 overlap. The second shot area STb and the third shot area STc of the wafer 300 may share a second double overlap area DLbc in which a portion of the second shot area STb and a portion of the third shot area STc of the wafer 300 overlap. The third shot area STc and the fourth shot area STd of the wafer 300 may share a third double overlap area DLcd in which a portion of the third shot area STc and a portion of the fourth shot area STd of the wafer 300 overlap. The fourth shot area STd and the first shot area STa of the wafer 300 may share a fourth double overlap area DLda in which a portion of the fourth shot area STd and a portion of the first shot area STa of the wafer 300 overlap. The first shot area STa, the second shot area STb, the third shot area STc, and the fourth shot area STd may share the quad overlap area QL in which a portion of the first shot area STa, a portion of the second shot area STb, a portion of the third shot area STc, and a portion of the fourth shot area STd overlap. In the present specification, the double overlap areas DLab, DLbc, DLcd, and DLda and the quad overlap area QL may be referred to as overlap areas.

The first shot area STa may have the first non-overlap area NLa that does not overlap the other shot areas STb, STc, and STd, the second shot area STb may have the second non-overlap area NLb that does not overlap the other shot areas STa, STc, and STd, the third shot area STc may have the third non-overlap area NLc that does not overlap the other shot areas STa, STb, and STd, and the fourth shot area STd may have the fourth non-overlap area NLd that does not overlap the other shot areas STa, STb, and STc.

The main pattern MP of the mask 200 may be projected onto each of the first to fourth non-overlapping areas NLa to NLd of the first to fourth shot areas STa to STd of the wafer 300. For example, the main pattern MP of the mask 200 may expose a portion of photoresist on the first to fourth non-overlapping areas NLa to NLd of the first to fourth shot areas STa to STd of the wafer 300 to light. The first dummy pattern D1 and the second dummy pattern D2 of the mask 200 may be projected onto the double overlap areas DLab, DLbc, DLcd, and DLda of the first to fourth shot areas STa to STd of the wafer 300. For example, the first dummy pattern D1 and the second dummy pattern D2 of the mask 200 may expose a portion of photoresist on the double overlap areas DLab, DLbc, DLcd, and DLda of the first to fourth shot areas STa to STd of the wafer 300 to light. The third dummy patterns D3 of the mask 200 may be projected onto the quad overlap area QL of the first to fourth shot areas STa to STd of the wafer 300. For example, the third dummy patterns D3 of the mask 200 may expose a portion of photoresist on the quad overlap area QL of the first to fourth shot areas STa to STd of the wafer 300 to light. The blocking pattern BP of the mask 200 may not be projected onto the wafer 300. For example, the blocking pattern BP of the mask 200 may not expose light to outside of the first to fourth shot areas STa to STd of the wafer 300. The blocking pattern BP of the mask 200 may block light from areas other than the first to fourth shot areas STa to STd. Therefore, the blocking pattern BP may reduce a change in size of a resultant pattern, which may occur by exposure of the non-overlap area NLb of another shot area (for example, second shot area STb) outside the shot area (for example, first shot area STa) of the wafer 300 to scattered light.

Figure 4:
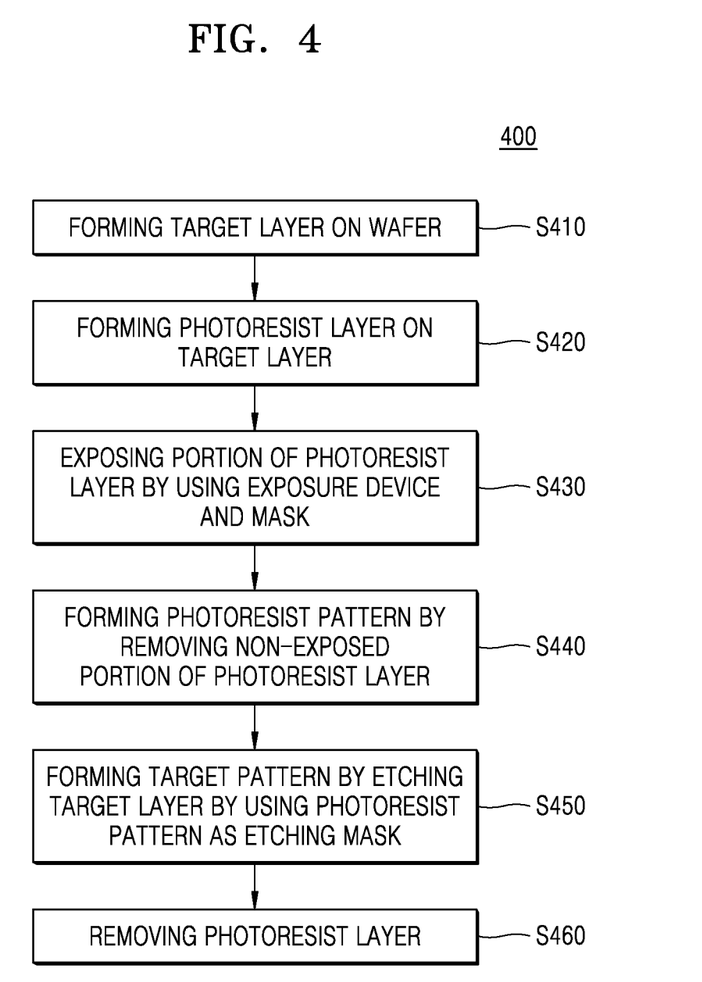
FIG. 4 is a flowchart illustrating a photolithography method, according to an example embodiment of the inventive concept.

FIG. 4 is a flowchart illustrating a photolithography method 400, according to an example embodiment of the inventive concept. FIGS. 5A to 5F are cross-sectional views illustrating the photolithography method 400, according to an example embodiment of the inventive concept.

Figure 5A:
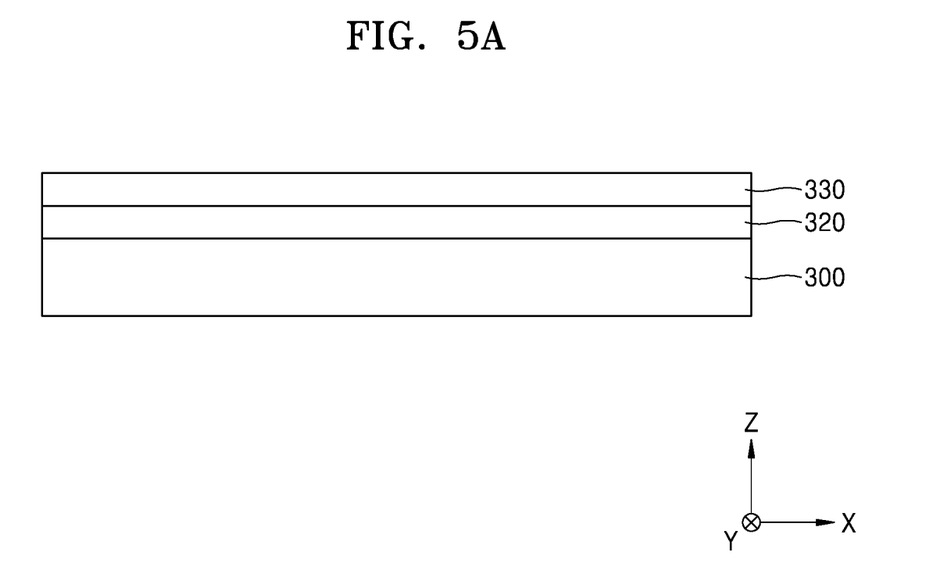
FIGS. 5A to 5F are cross-sectional views illustrating the photolithography method, according to an example embodiment of the inventive concept.

Referring to FIGS. 4 and 5A, a target layer 320 may be formed on the wafer 300 in operation S410. The target layer 320 may include an arbitrary material, for example, a conductive material, an insulating material, or a semiconductor material. The target layer 320 may be formed by an arbitrary method well known to those skilled in the art, for example, chemical vapor deposition (CVD), physical vapor deposition (PVD), atomic layer deposition (ALD), or spin coating.

Next, a photoresist layer 330 may be formed on the target layer 320 in operation S420. For example, the photoresist layer 330 may be formed by spin coating. The photoresist layer 330 may include positive photoresist. Positive photoresist may be, for example, polymer having an acid-labile group, a photo acid generator (PAG), a solvent, or another additive. The PAG may generate acid when exposed to light. When polymer having the acid-labile group reacts to acid, the solubility of a polymer in developing solution may change. Therefore, a difference in solubility in the developing solution may occur between the exposed area and non-exposed area of polymer.

The PAG may include onium salt, for example, one or more of triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; a nitrobenzyl derivative, for example, 2-nitrobenzyl-p-toluenesulfonate, 2,6-dinitrobenzyl-p-toluenesulfonate, or 2,4-dinitrobenzyl-p-toluenesulfonate; a sulfonic acid ester, for example, 1,2,3-tris(methanesulfonyloxy)benzene, 1,2,3-tris (trifluoromethanesulfonyloxy)benzene, or 1,2,3-tris(p-toluenesulfonyloxy)benzene; a diazomethane derivative, for example, bis(benzenesulfonyl)diazomethane or bis(p-toluenesulfonyl)diazomethane; a glyoxime derivative, for example, bis-O-(p-toluenesulfonyl)-α-dimethylglyoxime or bis-O-(n-butanesulfonyl)-α-dimethylglyoxime; a sulfonic acid ester derivative of an N-hydroxyimide compound, for example, an N-hydroxysuccinimide methanesulfonic acid ester or an N-hydroxysuccinimide trifluoromethanesulfonic acid ester; and a halogen-containing triazine compound, for example, 2-(4-methoxyphenyl)-4,6-bis(trichloromethyl)-1,3,5-triazine or 2-(4-methoxynaphthyl)-4,6-bis(trichloromethyl)-1,3,5-triazine.

The solvent of positive photoresist may include, for example, one or more of glycol ether such as 2-methoxyethyl ether(diglyme), ethylene glycol monomethyl ether, or propylene glycol monomethyl ether; propylene glycol monomethyl ether acetate; lactate such as methyl lactate or ethyl lactate; methyl propionate, ethyl propionate, propionate such as ethyl ethoxy propionate or methyl-2-hydroxy isobutyrate; Cellosolve ester such as methyl Cellosolve acetate; aromatic hydrocarbon such as toluene or xylene; and ketone such as methylethyl ketone, cyclohexanone, or 2-heptanone.

Figure 5B:
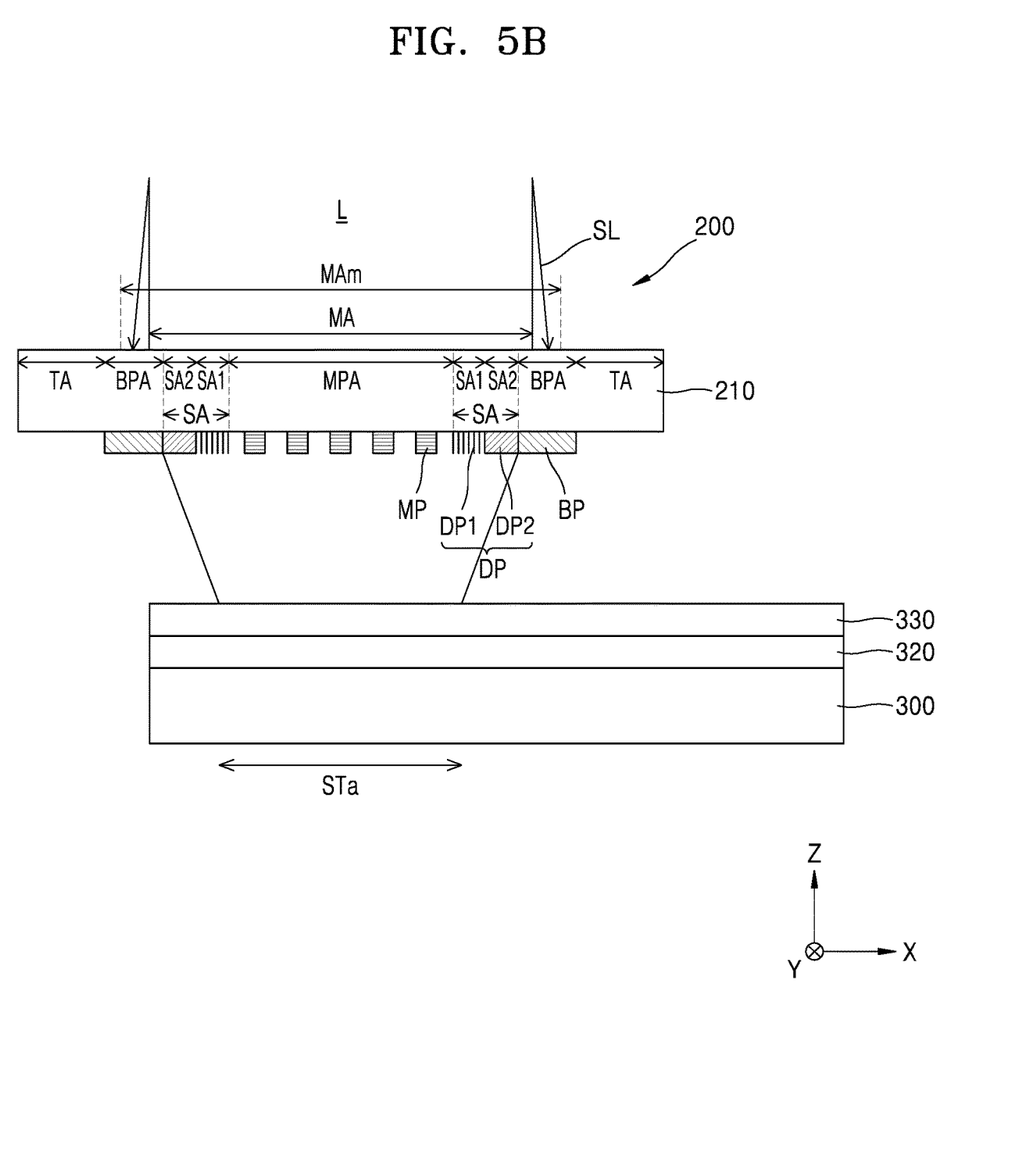

Referring to FIGS. 4 and 5B, by using the exposure device 100 illustrated in FIG. 1 and the mask 200 illustrated in FIGS. 2A and 2B, a portion of the photoresist layer 330 on the wafer 300 may be exposed in operation S430. A portion of light L illuminated onto the area MA of the mask 200 may pass through the mask 200 and expose a portion of the photoresist layer 330 on the first shot area STa of the wafer 300 to light. On the other hand, the scattered light SL incident on the outside of the desired area of the mask 200 is blocked by the blocking pattern BP of the mask 200 and may not reach the photoresist layer 330 on the wafer 300.

Figure 5C:
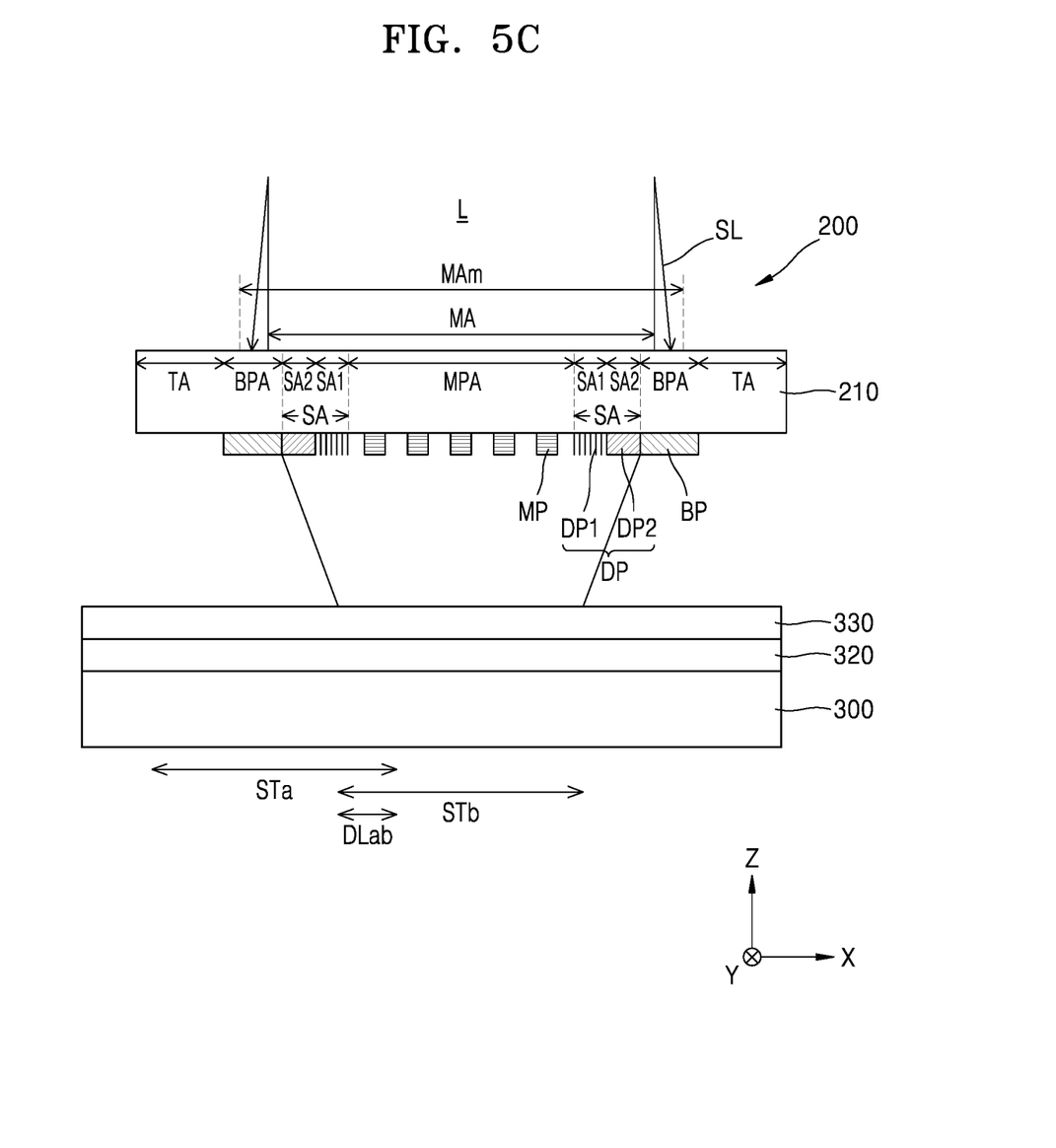

Referring to FIGS. 4 and 5C, in operation S430 of exposing a portion of the photoresist layer 330 on the wafer 300, a step-and-repeat method may be used. For example, portions of the photoresist layer 330 on the first to fourth shot areas STa to STd of the wafer 300 may be sequentially exposed. For example, as described above, a portion of the photoresist layer 330 on the first shot area STa of the wafer 300 may be exposed, the wafer 300 and/or the mask 200 may be moved, and then, a portion of the photoresist layer 330 on the second shot area STb may be exposed. The second shot area STb of the wafer 300 may overlap the first shot area STa. Therefore, the first double overlap area DLab of the wafer 300 may be exposed twice. Similarly, the remaining shot areas (for example, STc and STd) of the wafer 300 may be sequentially exposed. The quad overlap area QL (refer to FIG. 3) of the wafer 300 may be exposed four times.

After performing exposure, post exposure bake (PEB) may be performed. The PEB is well known to those skilled in the art and may be performed, for example, on a hot plate or in an oven for about 30 seconds to about 2 minutes in a temperature range between about 80° C. to about 150° C.

Figure 5D:
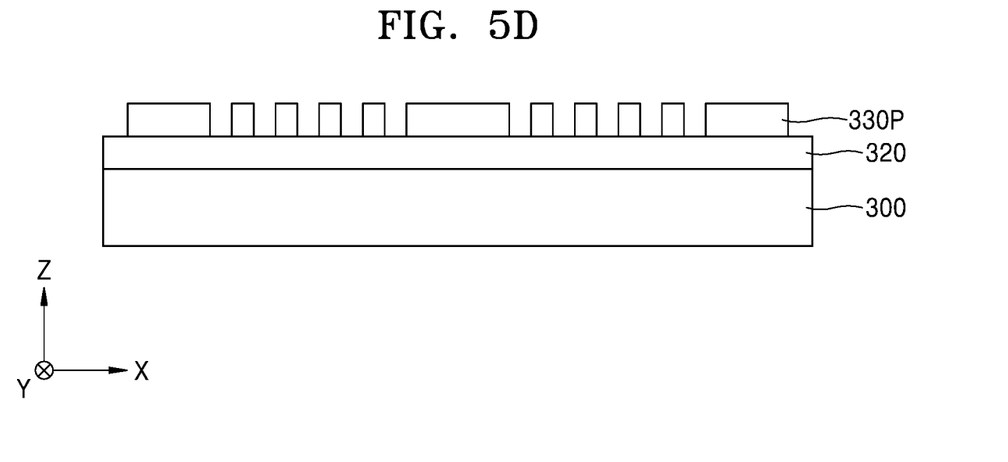

Referring to FIGS. 4, 5C, and 5D, by removing a non-exposed portion of the photoresist layer 330, a photoresist pattern 330P may be formed in operation S440. Operation S440 of forming the photoresist pattern 330P may include a negative tone development (NTD) process. In conventional positive tone development, an exposed portion of positive photoresist may be dissolved in a developer including an alkali aqueous solution and removed, and only a non-exposed portion of positive photoresist may be left. On the other hand, in the NTD process, since a developer including an organic solvent instead of the alkali aqueous solution is used, the exposed portion of positive photoresist is left and the non-exposed portion of positive photoresist may be dissolved and removed. By using the NTD, a finer pattern may be formed.

The organic solvent included in the developer may be, for example, ketone, ester, ether, amide, hydrocarbon, or a combination of the above materials. The ketone solvent may be, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone, or methyl isobutyl ketone. The ester solvent may be, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, or propyl lactate. The ether solvent may be, for example, a dioxane, tetrahydrofuran, or a glycol ether solvent, for example, ethylene glycol monomethyl ether, propylene glycol monomethyl ether, ethylene glycol monoethyl ether, propylene glycol monoetyl ether, diethylene glycol monomethyl ether, triethylene glycol monoethyl ether, or methoxymethyl butanol. The amide solvent may be, for example, N-methyl-2-pyrolidone, N,N-dimethylacetamide, or N,N-dimethylformamide. The hydrocarbon solvent may be, for example, an aromatic hydrocarbon solvent, for example, toluene or xylene.

Figure 5E:
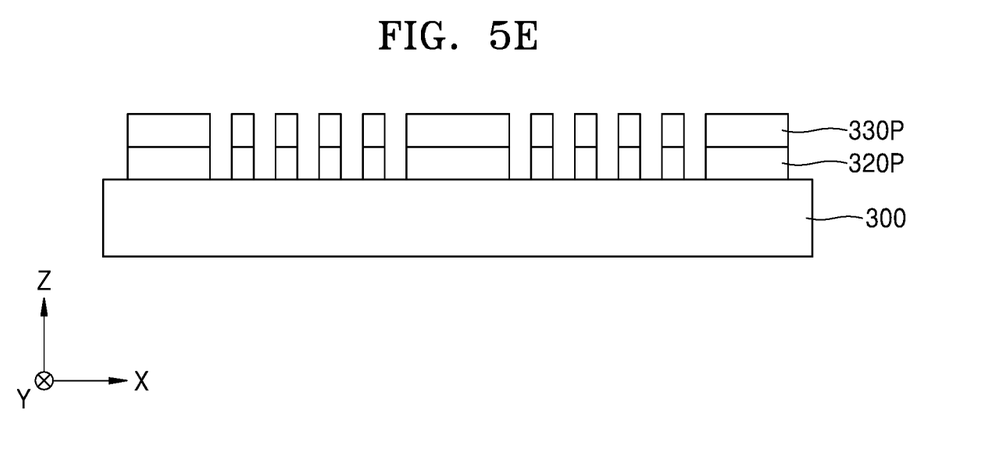

Referring to FIGS. 4, 5D, and 5E, by etching the target layer 320 by using the photoresist pattern 330P as an etching mask, a target pattern 320P may be formed in operation S450. The target layer 320 may be etched by using dry etching such as reactive ion etching (RIE), plasma etching, or sputter etching; wet etching; or a combination of the above etching methods.

Figure 5F:
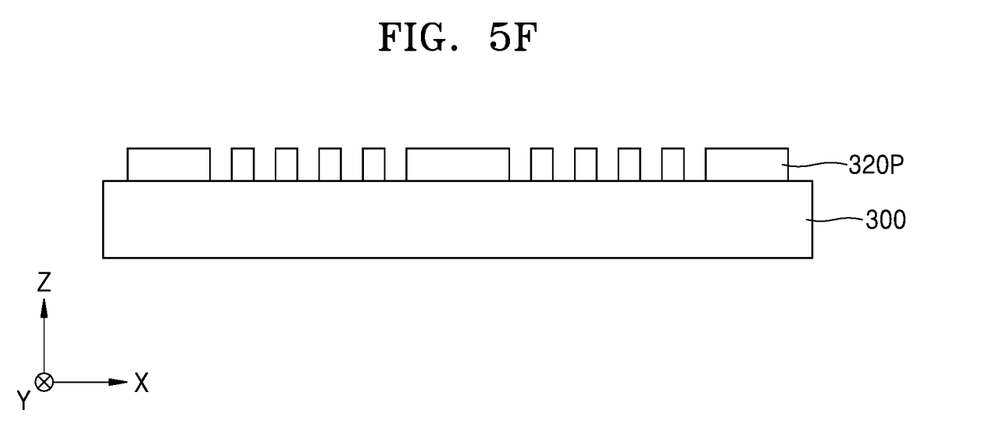

Referring to FIGS. 4, 5E, and 5F, the photoresist pattern 330P may be removed in operation S60. In order to remove the photoresist pattern 330P, a method well known to those skilled in the art may be used, such as, for example, oxygen plasma ashing.

The photolithography method 400 described above according to an example embodiment of the inventive concept may be applied to manufacturing various semiconductor devices, for example, a memory device, a logic device, and a combination of the above devices. The memory device may be, for example, a dynamic random access memory (DRAM) device, a static random access memory (SRAM) device, a flash memory device, an electrically erasable and programmable read-only memory (EEPROM) device, a phase-change random access memory (PRAM) device, a magnetic random access memory (MRAM) device, a resistive random access memory (RRAM) device, or a combination of the above devices. The logic device may be, for example, a central processing unit (CPU), a graphics processing unit (GPU), a controller, an application specific integrated circuit (ASIC), an application processor (AP), or a combination of the above units.

While the inventive concept has been particularly shown and described with reference to embodiments thereof, it will be understood that various changes in form and details may be made therein without departing from the spirit and scope of the following claims.

What is claimed is:

1. A photolithography method comprising:
forming a photoresist layer on a wafer;
exposing a portion of the photoresist layer by using an exposure device and a mask; and
forming a photoresist pattern by removing a non-exposed portion of the photoresist layer,
wherein the mask comprises a substrate having a main pattern area and a blocking area outside the main pattern area, a main pattern on the main pattern area of the substrate, and a blocking pattern on the blocking area of the substrate,
wherein an external circumference of the blocking pattern extends to a maximum area of the mask to be illuminated by the exposure device or to the outside of the maximum area of the mask,
wherein the exposing of the portion of the photoresist layer comprises:
exposing a portion of the photoresist layer on a first shot area of the wafer; and
exposing a portion of the photoresist layer on a second shot area of the wafer, and
wherein the first shot area and the second shot area of the wafer share a double overlap area in which a portion of the first shot area and a portion of the second shot area of the wafer overlap.

2. The photolithography method of claim 1, wherein the forming of the photoresist pattern comprises negative tone development (NTD).

3. The photolithography method of claim 1,
wherein the substrate of the mask further comprises a transmissive area positioned outside the blocking area, and
wherein the blocking pattern does not cover the transmissive area of the substrate.

4. The photolithography method of claim 1,
wherein the substrate of the mask further comprises a scribe lane area between the main pattern area and the blocking area, and
wherein the mask further comprises a dummy pattern positioned on a scribe lane of the substrate and configured to expose a portion of the photoresist layer on the double overlap area of the wafer to light.

5. The photolithography method of claim 4,
wherein the scribe lane area of the substrate of the mask comprises a first sub-scribe lane area adjacent to the main pattern area and a second sub-scribe lane area adjacent to the blocking area, and
wherein the dummy pattern comprises a first dummy pattern on the first sub-scribe lane area of the substrate and a second dummy pattern on the second sub-scribe lane area of the substrate.

6. The photolithography method of claim 5, wherein the exposing of the portion of the photoresist layer further comprises:
exposing a portion of the photoresist layer on a third shot area of the wafer; and
exposing a portion of the photoresist layer on a fourth shot area of the wafer,
wherein the first shot area, the second shot area, the third shot area, and the fourth shot area of the wafer share a quad overlap area in which a portion of the first shot area, a portion of the second shot area, a portion of the third shot area, and a portion of the fourth shot area of the wafer overlap, and
wherein the dummy pattern further comprises third dummy patterns configured to expose a portion of the photoresist layer on the quad overlap area of the wafer to light.

7. A photolithography method comprising:
forming a target layer on a wafer;
forming a photoresist layer on the target layer;
exposing a portion of the photoresist layer by using an exposure device and a mask;
forming a photoresist pattern by removing a non-exposed portion of the photoresist layer using negative tone development (NTD);
forming a target pattern by etching the target layer using the photoresist pattern as an etching mask; and
removing the photoresist pattern,
wherein the mask comprises a main pattern configured to be projected onto a non-overlap area of a shot area of the wafer, a dummy pattern configured to be projected onto an overlap area of the shot area of the wafer, and a blocking pattern configured not to be projected onto the wafer,
wherein an external length of the blocking pattern in an X direction is greater than or equal to multiplication of a length of a maximum shot area of the wafer to be illuminated by the exposure device in the X direction by a mask-wafer reduction ratio of the exposure device, and
wherein an external length of the blocking pattern in a Y direction is greater than or equal to multiplication of a length of the maximum shot area of the wafer to be illuminated by the exposure device in the Y direction by the mask-wafer reduction ratio of the exposure device.

8. The photolithography method of claim 7, wherein the length of the maximum area of the wafer in the X direction is 26 mm and the length of the maximum area of the wafer in the Y direction is 33 mm.

9. The photolithography method of claim 7, wherein the exposing of the portion of the photoresist layer comprises:
exposing the portion of the photoresist layer using a step-and-repeat method.

10. A photolithography method comprising:
forming a photoresist layer on a wafer;
exposing a portion of the photoresist layer by using an exposure device and a mask; and
forming a photoresist pattern by removing a non-exposed portion of the photoresist layer,
wherein the exposure device comprises an illuminator configured to control light received from a light source and illuminate the mask, a mask table on which the mask is mounted, a mask blinder positioned between the mask table and the illuminator and configured to control an area of the mask illuminated by the exposure device in a maximum area of the mask to be illuminated by the exposure device, a projection system configured to project light that passes through the mask onto the wafer, and a wafer table on which the wafer is mounted,
wherein the mask comprises a substrate having a main pattern area and a blocking area that two-dimensionally surrounds the main pattern area, a main pattern on the main pattern area of the substrate, and a blocking pattern on the blocking area of the substrate,
wherein an external length of the blocking pattern in an X direction is greater than or equal to a length of the maximum area of the mask in the X direction, and
wherein an external length of the blocking pattern in a Y direction is greater than or equal to a length of the maximum area of the mask in the Y direction.

11. The photolithography method of claim 10, wherein a ratio of the length of the maximum area of the mask in the X direction to the length of the maximum area of the mask in the Y direction is 26:33.

12. The photolithography method of claim 11, wherein the length of the maximum area of the mask in the X direction is 104 mm and the length of the maximum area of the mask in the Y direction is 132 mm.

13. The photolithography method of claim 10, wherein the photoresist layer comprises positive photoresist.

14. The photolithography method of claim 10, wherein the blocking pattern reflects light.

15. The photolithography method of claim 14, wherein the blocking pattern comprises a chrome (Cr)-based material.

16. The photolithography method of claim 10, wherein the main pattern reverses a phase of light that passes through the main pattern.

17. The photolithography method of claim 16, wherein the main pattern comprises a MoSi-based material.

18. The photolithography method of claim 10, wherein the light source emits deep ultraviolet light.

* * * * *